United States Patent
Morita et al.

(10) Patent No.: US 9,189,724 B2
(45) Date of Patent: *Nov. 17, 2015

(54) SEMICONDUCTOR DEVICE, PORTABLE COMMUNICATION TERMINAL, IC CARD, AND MICROCOMPUTER

(71) Applicant: RENESAS ELECTRONICS CORPORATION, Kawasaki-shi, Kanagawa (JP)

(72) Inventors: Shin Morita, Tokyo (JP); Norihisa Yamamoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/546,829

(22) Filed: Nov. 18, 2014

(65) Prior Publication Data

US 2015/0072737 A1 Mar. 12, 2015

Related U.S. Application Data

(63) Continuation of application No. 12/695,204, filed on Jan. 28, 2010, now Pat. No. 8,908,671.

(30) Foreign Application Priority Data

Jan. 30, 2009 (JP) .................................. 2009-019538

(51) Int. Cl.
*G06K 19/07* (2006.01)
*G06K 7/10* (2006.01)
*H04B 1/40* (2015.01)
*H04L 7/00* (2006.01)
(Continued)

(52) U.S. Cl.
CPC ........ *G06K 19/0723* (2013.01); *G06K 7/10237* (2013.01); *H04B 1/40* (2013.01); *H04L 7/0025* (2013.01); *H04B 7/00* (2013.01); *H04L 25/49* (2013.01)

(58) Field of Classification Search
None
See application file for complete search history.

(56) References Cited

U.S. PATENT DOCUMENTS

| 7,392,947 B2 | 7/2008 | Higashi |
| 2006/0109059 A1 | 5/2006 | Skerritt |

(Continued)

FOREIGN PATENT DOCUMENTS

| JP | 04-008016 A | 1/1992 |
| JP | 2003-333112 | 11/2003 |
| JP | 2007-102383 A | 4/2007 |

OTHER PUBLICATIONS

Office Action issued Mar. 14, 2013, in Japanese Patent Application No. 2009-019538, and English translation.

(Continued)

*Primary Examiner* — Kodzovi Acolatse
(74) *Attorney, Agent, or Firm* — Miles & Stockbridge P.C.

(57) ABSTRACT

The present invention provides a noncontact interface technique capable of performing communication operation without stopping an internal operation even when a clock signal cannot be extracted from a carrier wave. In a semiconductor device that receives a modulated carrier wave from an antenna, generates an internal clock signal on the basis of a clock signal extracted from the received carrier wave, and performs operation synchronously with the internal clock signal, a PLL circuit that receives the extracted clock signal and generates the internal clock signal is provided with a voltage control oscillation function. In the case where the clock signal extracted from the carrier wave is discretely interrupted, the function makes the internal clock signal maintained at a frequency immediately before the interruption. With the configuration, even when the clock signal extracted from the carrier wave is interrupted, internal data processes such as decoding and bus interfacing can be continued.

7 Claims, 11 Drawing Sheets

(51) Int. Cl.
*H04L 25/49* (2006.01)
*H04B 7/00* (2006.01)

(56) References Cited

U.S. PATENT DOCUMENTS

| | | | |
|---|---|---|---|
| 2007/0018734 A1* | 1/2007 | Cheng et al. | 331/16 |
| 2007/0075143 A1* | 4/2007 | Higashi | 235/451 |
| 2008/0191862 A1* | 8/2008 | Teraoka | 340/506 |
| 2008/0219444 A1* | 9/2008 | Benteo et al. | 380/255 |

OTHER PUBLICATIONS

Office Action issued Sep. 27, 2012, in Japanese Patent Application No. 2009-019538, and English translation.

* cited by examiner

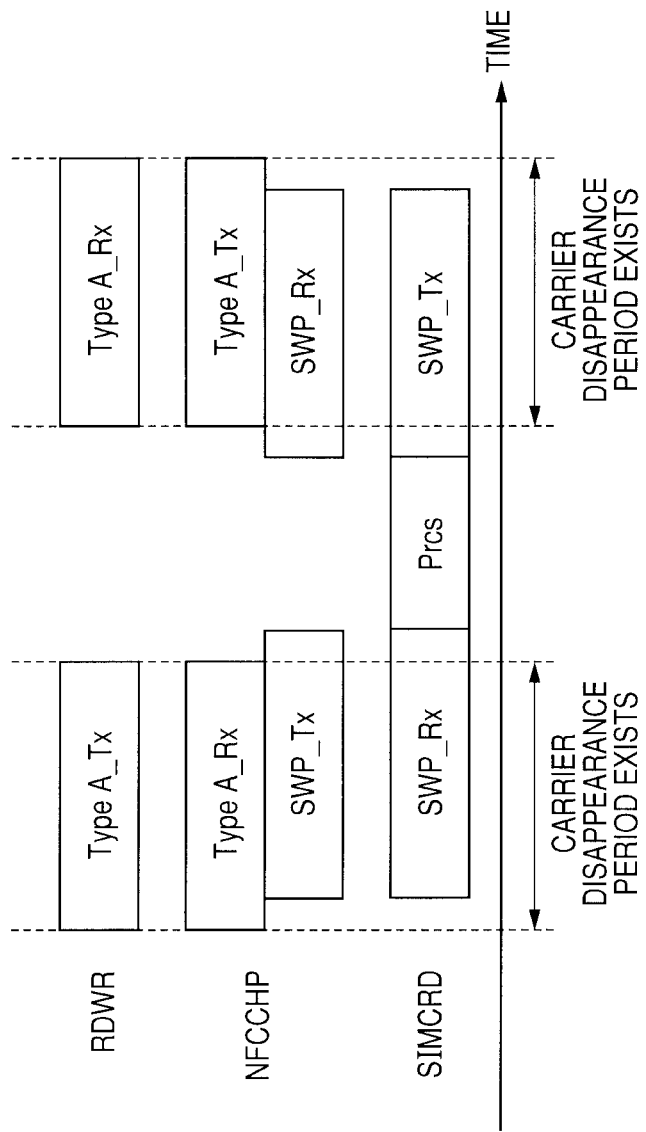

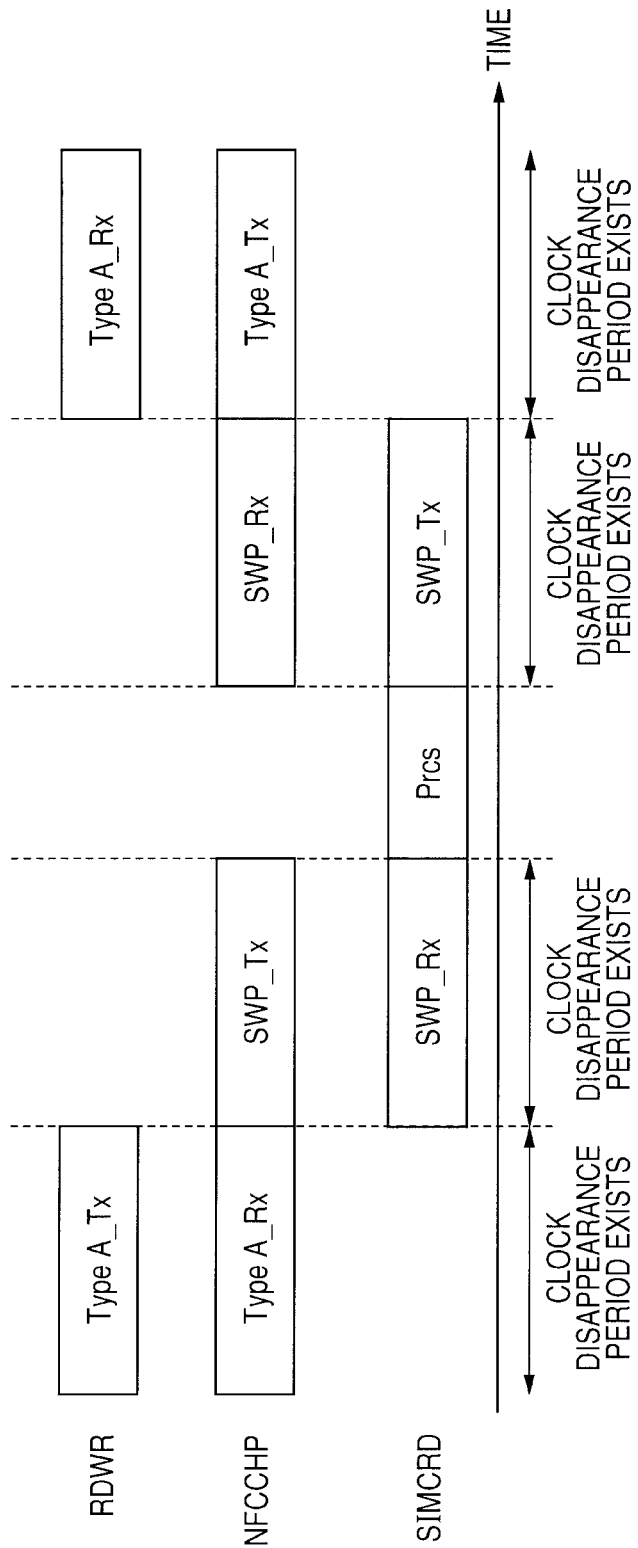

SEMICONDUCTOR DEVICE, PORTABLE COMMUNICATION TERMINAL, IC CARD, AND MICROCOMPUTER

CROSS-REFERENCE TO RELATED APPLICATION

The disclosure of Japanese Patent Application No. 2009-19538 filed on Jan. 30, 2009 including the specification, drawings and abstract is incorporated herein by reference in its entirety.

BACKGROUND OF THE INVENTION

The present invention relates to a semiconductor device, a portable communication terminal, an IC card, and a microcomputer having a near field communication (NFC) function using electromagnetic induction.

In a noncontact communication system, a noncontact communication card operates synchronously with a clock signal extracted from a carrier wave supplied from a reader/writer. Therefore, when the carrier wave disappears during communication, the clock signal cannot be extracted, and the operation of the communication card is stopped. For example, in the case of inputting an ASK (Amplitude Shift Keying) 100% modulation signal whose modulation target is 100% of amplitude from an antenna, the carrier wave disappears during an input signal modulation period, and the clock signal cannot be extracted. It is also assumed that the carrier wave disappears for other reasons.

Japanese Unexamined Patent Publication No. 2007-102383 discloses a technique that, when a carrier wave breaks in a communication of type A using an ASK 100% modulation signal, an internal clock is temporarily stopped, thereby adjusting the operations of internal circuits such as a decoding circuit both at the time of reception of an ASK 100% modulation signal and at the time of reception of an ASK 10% modulation signal.

SUMMARY OF THE INVENTION

The inventors of the present invention examined an application such that a noncontact communication semiconductor device (also called NFC chip) uses its communication data and interfaces with another data processing circuit in parallel with noncontact communication by the noncontact communication semiconductor device. For example, it relates to a case of interfacing an NFC chip with an SIM card, authentication on communication using the NFC chip is performed directly by the interface with the SIM card. The SIM card and the NFC chip are not interfaced via a baseband processor, an application processor, or the like. For the interface between the NFC chip and the SIM card, the SWP (Single Wired Protocol) is used. The SWP is asynchronous communication based on a state where each of an NFC chip and an SIM card operates synchronously with a clock. The normal communication cannot be performed in a state where the clock disappearance period is not known. A modulation period as the clock disappearance period in the ASK 100% modulation signal varies according to a signal value. Therefore, communication according to the SWP cannot be performed in parallel with the noncontact communication. A serial process of performing the noncontact communication and then performing the SWP communication is necessary, so that communication efficiency drops conspicuously. Further, the fact itself that the internal operations stop when a clock signal cannot be extracted from the carrier wave makes the efficiency of communication operation by the NFC chip deteriorate.

An object of the present invention is to provide a noncontact interface technique capable of performing communication operation without stop of internal operations even when a clock signal cannot be extracted from a carrier wave.

Another object of the present invention is to provide a noncontact interface technique capable of performing communication according to the SWP or the like in parallel with noncontact communication.

The above and other objects and novel features of the present invention will become apparent from the description of the specification and the attached drawings.

Outline of representative ones of inventions disclosed in the application will be briefly described as follows.

In a semiconductor device that receives a modulated carrier wave from an antenna, generates an internal clock signal on the basis of a clock signal extracted from the received carrier wave, and performs operation synchronously with the internal clock signal, a PLL circuit that receives the extracted clock signal and generates the internal clock signal is provided with a voltage controlled oscillation function. In the case where the clock signal extracted from the carrier wave is discretely interrupted, the function makes the internal clock signal maintained at a frequency immediately before the interruption.

With the configuration, even when the clock signal extracted from the carrier wave is interrupted, internal data processes such as decoding and bus interfacing can be continued.

Effects obtained by the representative ones of the inventions disclosed in the application will be briefly described as follows.

Even when a clock signal cannot be extracted from a carrier wave, communication operation can be performed without stopping the internal operations.

In addition, communication according to the SWP can be performed in parallel with noncontact communication.

BRIEF DESCRIPTION OF THE DRAWINGS

FIG. 13 is a timing chart illustrating operations of performing data interface with an SIM card in parallel with noncontact communication by the NFC chip of FIG. 12.

FIG. 14 is a timing chart showing operations of a comparative example of serially performing the noncontact communication and the data interface with the SIM card by the NFC chip.

DETAILED DESCRIPTION OF THE PREFERRED EMBODIMENTS

1. Outline of Embodiments

Figure 1:
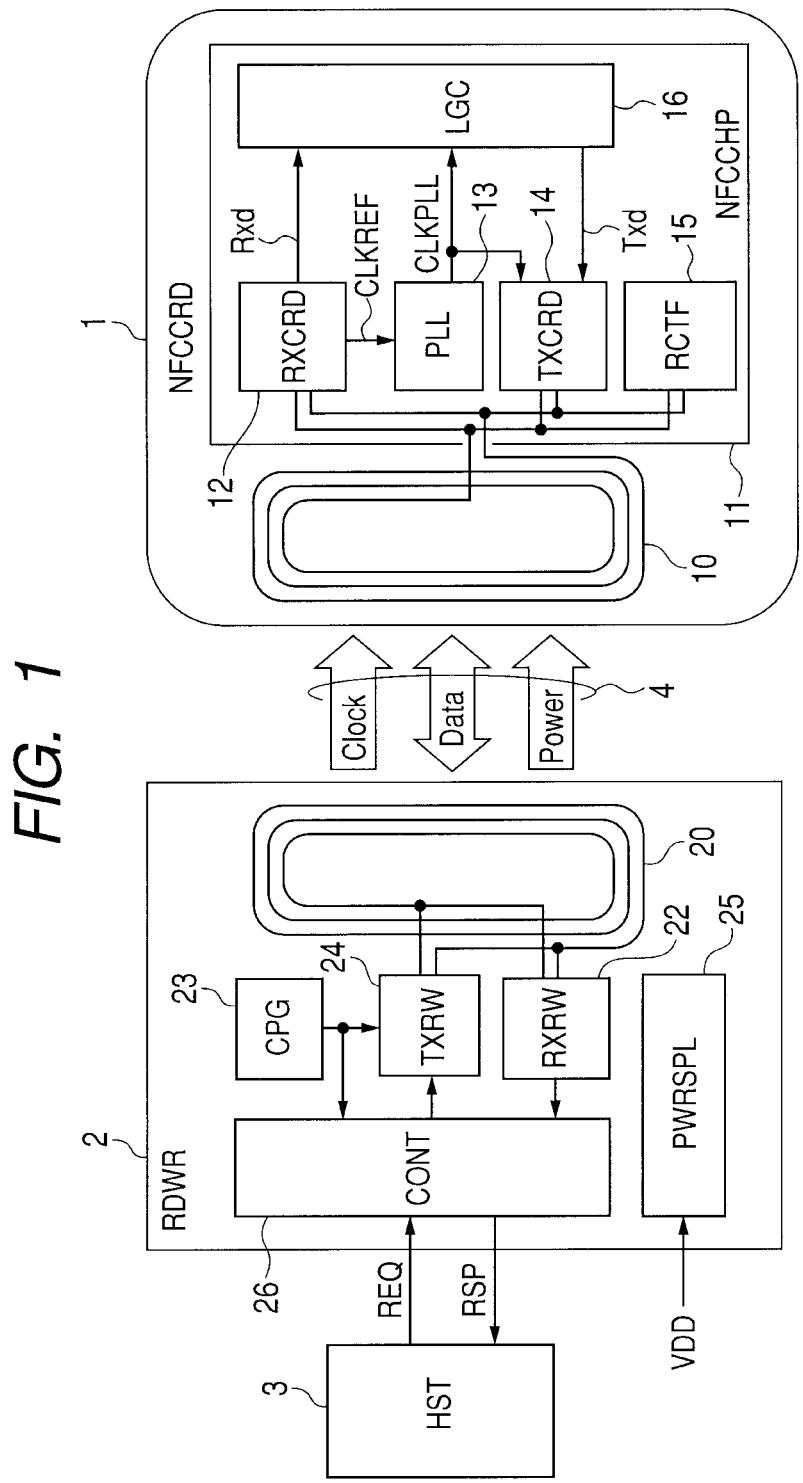
FIG. 1 is a block diagram showing outline of an NFC system using an NFC card (NFCCRD) according to an example of the invention.

First, outline of representative embodiments of the invention disclosed in the application will be described. Reference numerals in the diagrams, referred to with parentheses in the description of the outline of the representative embodiments, just indicate components included in the concept of the components to which the reference numerals are designated.

[1] A semiconductor device (11, 11A) according to a representative embodiment of the present invention has: a reception circuit (12) to receive an amplitude-modulated carrier wave from an antenna (10), to demodulate it, and to extract a clock signal (CLKREF) from the carrier wave (CRR); a transmission circuit (14) to transmit a signal modulated on the basis of transmission data from the antenna; a logic circuit (16) to perform a data process for transmission/reception by the transmission circuit and the reception circuit; and a PLL circuit (13) to receive the clock signal extracted by the reception circuit, to generate an internal clock signal (CLKPLL) of the logic circuit, and to perform a control of bringing the internal clock signal into synchronization with the extracted clock signal. In a period of disappearance of the carrier wave received from the antenna, the PLL circuit performs a control for maintaining frequency of the internal clock signal to a value immediately before the disappearance period.

With the configuration, even when the clock signal extracted from the carrier wave is interrupted, internal data processes such as decoding and bus interfacing can be continued. Therefore, also when the clock signal cannot be extracted from the carrier wave, the communication operation can be performed without stopping the internal operation. In addition, communication according to SWP or the like can be performed in parallel with noncontact communication.

[2] In the semiconductor device of [1], the PLL circuit has a voltage controlled oscillation circuit (103) having an input terminal to which a low pass filter (102) is coupled, and performs the maintaining control by stopping charging/discharging on an input of the low pass filter in the period of disappearance of the carrier wave input from the antenna. When a clock input stops in a conventional PLL circuit, an ordinary voltage control oscillation function is to decrease the frequency of a feedback input in accordance with the stop. The means of the present invention largely differs from the ordinary voltage control oscillation function.

[3] In the semiconductor device of [1], the amplitude modulation is ASK 100% modulation whose target is 100% of amplitude of a carrier wave. The modulation percentage is not limited to 100% for the reason that disappearance of an extracted clock is assumed to occur also depending on a communication situation or the like.

[4] In the semiconductor device of [3], modulation performed by the transmission circuit is load modulation.

[5] The semiconductor device of [1] further includes an internal power supply circuit (15) to generate an internal operation power supply voltage by receiving the carrier wave and rectifying it.

[6] The semiconductor device of [1] further includes an external power supply terminal (51) to which an operation power is supplied from the outside of the semiconductor device. During the carrier wave is interrupted, current or voltage integrating operation by rectifying operation is interrupted. Even when the power supply voltage drops in the relation with stabilizing capacity, it can be compensated by an external power supply.

[7] The semiconductor device of [1] is formed, for example, on a single semiconductor substrate.

[8] In the semiconductor device of [1], the logic circuit has a host interface circuit (53) and an SIM interface circuit (52). A use form of coupling an SIM card to an NFC chip and performing authentication using a noncontact interface directly with the SIM card is considered.

[9] Considering application of the present invention to a portable communication terminal, a portable communication terminal (70) is provided with: the semiconductor device of [8]; a host microcomputer (57) coupled to a host interface circuit of the semiconductor device; an SIM card slot (56) coupled to an SIM interface circuit of the semiconductor device; an RF circuit (61) for mobile communication coupled to the host microcomputer; and a battery power supply (54) to supply operation power to each of the circuits.

[10] Considering application of the present invention to an IC card, an IC card is obtained by mounting the semiconductor device of [1] on a card substrate having an antenna.

[11] A semiconductor device according to another aspect of the present invention has: a reception circuit to receive an amplitude-modulated carrier wave from an antenna, to demodulate it, and to extract a clock signal from the carrier wave; a logic circuit to perform a data process on a reception signal by the reception circuit; and a PLL circuit to receive the clock signal extracted by the reception circuit, to generate an internal clock signal of the logic circuit, and to perform a control of bringing the internal clock signal into synchronization with the extracted clock signal. In a stop period in which a change in the extracted clock signal is stopped, the PLL circuit performs a control for maintaining frequency of the internal clock signal to a value immediately before the stop period.

With the configuration, even when the clock signal extracted from the carrier wave is interrupted, internal data processes such as decoding and bus interfacing can be continued. Therefore, also when the clock signal cannot be extracted from the carrier wave, the communication operation can be performed without stopping the internal operation. In addition, communication according to SWP or the like can be performed in parallel with noncontact communication.

[12] In the semiconductor device of [11], the PLL circuit has a voltage controlled oscillation circuit having an input terminal to which a low pass filter is coupled, and performs the maintaining control by stopping charging/discharging on an input of the low pass filter in the stop period.

[13] In the semiconductor device of [12], the PLL circuit includes: a phase frequency difference detection circuit (100)

to generate a charge error signal (ACL) and a discharge error signal (BRK) in accordance with a phase difference between the extracted clock signal and a feedback signal synchronized with an internal clock signal; and a charge/discharge circuit (101) to charge an output node (NDO) on receipt of the charge error signal and discharges the output node on reception of the discharge error signal. The output node of the charge/discharge circuit is coupled to an input of the low pass filter (102). The phase frequency difference detection circuit: when a specified relation is satisfied between a second period of a second logic value of the feedback signal (CLKFB) in a first period of a first logic value of the extracted clock signal (CLKREF) and a third period of the first logic value, the phase frequency difference detection circuit equalizes a charge amount of the output node by the charge error signal and a discharge amount of the output node by the discharge error signal, when the relation between the second period and the third period is deviated from the specified relation, the phase frequency difference detection circuit shifts the charge amount or the discharge amount of the output node so as to suppress a deviation amount, and the phase frequency difference detection circuit stops both charging of the output node performed in response to the charge error signal and discharging of the output node performed in response to the discharge error signal in accordance with disappearance of the first period caused by stop of a change in the extracted clock signal.

[14] In the semiconductor device of [11], the amplitude modulation is ASK 100% modulation whose target is 100% of amplitude of a carrier wave.

[15] The semiconductor device of [11] further includes an internal power supply circuit to generate an internal operation power supply voltage by receiving the carrier wave from an antenna and rectifying it.

[16] The semiconductor device of [11] further includes an external power supply terminal to which an operation power is supplied from the outside of the semiconductor device.

[17] The semiconductor device of [11] is formed, for example, on a single semiconductor substrate.

[18] In the semiconductor device of [11], the logic circuit has a host interface circuit and an SIM interface circuit.

[19] Considering application to a portable communication terminal, a portable communication terminal is provided with: the semiconductor device of [18]; a host microcomputer coupled to a host interface circuit of the semiconductor device; an SIM card slot coupled to an SIM interface circuit of the semiconductor device; an RF circuit for mobile communication coupled to the host microcomputer; and a battery power supply to supply operation power to each of the circuits.

[20] A microcomputer according to another aspect of the present invention includes: a communication circuit performing communication using electromagnetic induction by receiving a modulated carrier wave from an antenna, generating an internal clock signal on the basis of a clock signal extracted from the received carrier wave, decoding an input signal, and outputting the decoded data; and a data processing circuit that processes the data output from the communication circuit. Also in the case where the clock signal extracted from the carrier wave is interrupted discretely, the communication circuit continues the data decoding and outputting operation synchronously with the internal clock signal.

[21] In the microcomputer of [20], the communication circuit includes: a reception circuit to receive an amplitude-modulated carrier wave from an antenna, to demodulate it, and to extract a clock signal from the carrier wave; a logic circuit to decode the reception signal of the reception circuit, and to output the decoded data; and a PLL circuit to receive the clock signal extracted by the reception circuit, to generate an internal clock signal of the logic circuit, and to perform a control of bringing the internal clock signal into synchronization with the extracted clock signal. In a period of disappearance of the carrier wave received from the antenna, the PLL circuit performs a control for maintaining frequency of the internal clock signal to a value immediately before the disappearance period.

[22] In the microcomputer of [21], the PLL circuit has a voltage controlled oscillation circuit having an input terminal to which a low pass filter is coupled, and performs the maintaining control by stopping charging/discharging on an input of the low pass filter in the period of disappearance of the carrier wave input from the antenna.

[23] In the microcomputer of [20], the communication circuit includes: a reception circuit to receive an amplitude-modulated carrier wave from an antenna, to demodulate it, and to extract a clock signal from the carrier wave; a logic circuit to decode a signal received by the reception circuit and to output the decoded data; and a PLL circuit to receive the clock signal extracted by the reception circuit, to generate an internal clock signal of the logic circuit, and to perform a control of bringing the internal clock signal into synchronization with the extracted clock signal. In a stop period in which a change in the extracted clock signal is stopped, the PLL circuit performs a control for maintaining frequency of the internal clock signal to a value immediately before the stop period.

[24] In the microcomputer of [23], the PLL circuit has a voltage controlled oscillation circuit having an input terminal to which a low pass filter is coupled, and performs the maintaining control by stopping charging/discharging on an input of the low pass filter in the stop period.

2. Details of Embodiments

The embodiments will be described more specifically.

FIG. 1 shows an outline of an NFC system using an NFC card (NFCCRD) according to an example of the present invention. 1 denotes an NFC card, 2 denotes a reader/writer (RDWR) for the NFC card 1, and 4 indicates electromagnetic waves transmitted/received between the NFC card 1 and the reader/writer 2. In the diagram, the electromagnetic waves 4 are schematically expressed as clock, data, and power.

The reader/writer 2 is coupled to a host device 3. The host device 3 sends a request REQ to the reader/writer 2, and receives a response RSP to the request REQ. The reader/writer 2 makes the NFC card 1 readable/writable by radio communication and includes, although not limited, a transmission circuit (TXRW) 24, a reception circuit (RXRW) 22, a clock generation circuit (CPG) 23, a control circuit (CONT) 26, and a power supply circuit (PWRSPL) 25. The radio communication is so-called packet communication and is performed by dividing data into a plurality of packets.

The transmission circuit 24 generates a modulation control signal for performing amplitude shift keying (ASK) on the basis of transmission data received from the control circuit 26 and transmits an RF signal from a loop antenna 20 on the basis of the modulation control signal. The reception circuit 22 receives a load modulation signal transmitted from the NFC card 1 via the loop antenna 10, and modulates received data. The control circuit 26 controls the operation of the reception circuit 22 and the transmission circuit 24 and performs a control of returning a result of the operation to the host device 3 as necessary. The clock generation circuit 23 generates an operation reference clock signal of the reader/writer 2.

The reader/writer 2 releases a carrier signal (carrier wave) having a predetermined frequency from the loop antenna 20. When the loop antenna 10 of the NFC card 1 lies in a range where electromagnetic induction occurs with the loop antenna 20 of the reader/writer 2, a carrier signal is induced in the loop antenna 10. The induced voltage is used as operation power of the NFC card 1. The carrier signal is load-modulated with data to be transmitted in the NFC card 1 and the resultant is received by the reader/writer 2, thereby enabling data communication to be performed.

The NFC card 1 has, on a card substrate, the antenna 10 and an NFC chip (NFCCHP) 11 as a semiconductor device for an NFC card. The NFC chip 11 is an example of a semiconductor device according to the present invention and is formed by using the complementary MOS integrated circuit manufacturing technique or the like on a single semiconductor substrate such as single-crystal silicon. The NFC chip 11 has a reception circuit (RXCRD) 12, a PLL circuit (PLL) 13, a transmission circuit (TXCRD) 14, a rectifying circuit (RCTF) 15, and a logic circuit 16. The antenna 10 has a coil of a closed loop and, when current flowing in the coil changes, outputs an electromagnetic wave. When a magnetic flux passing through the coil as the antenna 10 changes, current flows in the antenna 10.

The reception circuit 12 receives an amplitude-modulated carrier wave from the antenna 10, receives current flowing in the antenna 10, demodulates the signal, supplies the signal to the logic circuit 16, and extracts a clock signal from the input carrier wave. The clock signal which is extracted will be simply called an extracted clock signal CLKREF.

The logic circuit 16 determines a sign type of a demodulation signal Rxd supplied from the reception circuit 12, decodes the demodulation signal according to the determined sign type, temporarily holds reception data obtained as a result of the decoding in a reception data buffer, stores the reception data std in the reception data buffer into a memory, or performs arithmetic operation, and stores the resultant data into a memory. The logic circuit 16 transfers data to be transmitted to another device such as a reader/writer from the memory to a transmission data buffer, encodes the transmission data, and generates a modulation control signal Txd.

The transmission circuit 14 makes impedance when the coil as the antenna 10 is seen from the outside change according to the modulation control signal Txd from the logic circuit 16. In the case where the reader/writer 2 outputs an electromagnetic wave as a carrier wave, thereby generating a magnetic field by high frequency around the antenna 10, the impedance of the coil as the antenna 10 changes, thereby changing the magnetic field around the antenna 10. Consequently, the carrier wave as the electromagnetic wave output from the reader/writer is modulated according to the modulation control signal, and transmission data generated by the logic circuit 16 is transmitted to the reader/writer 2 which outputs the electromagnetic wave.

The rectifying circuit 15 is configured by a rectifier and a stabilizing capacitor, rectifies a carrier wave received by the antenna, and accumulates charges in the stabilizing capacitor, thereby generating operation power (internal power) of the NFC chip 11.

Figure 2:
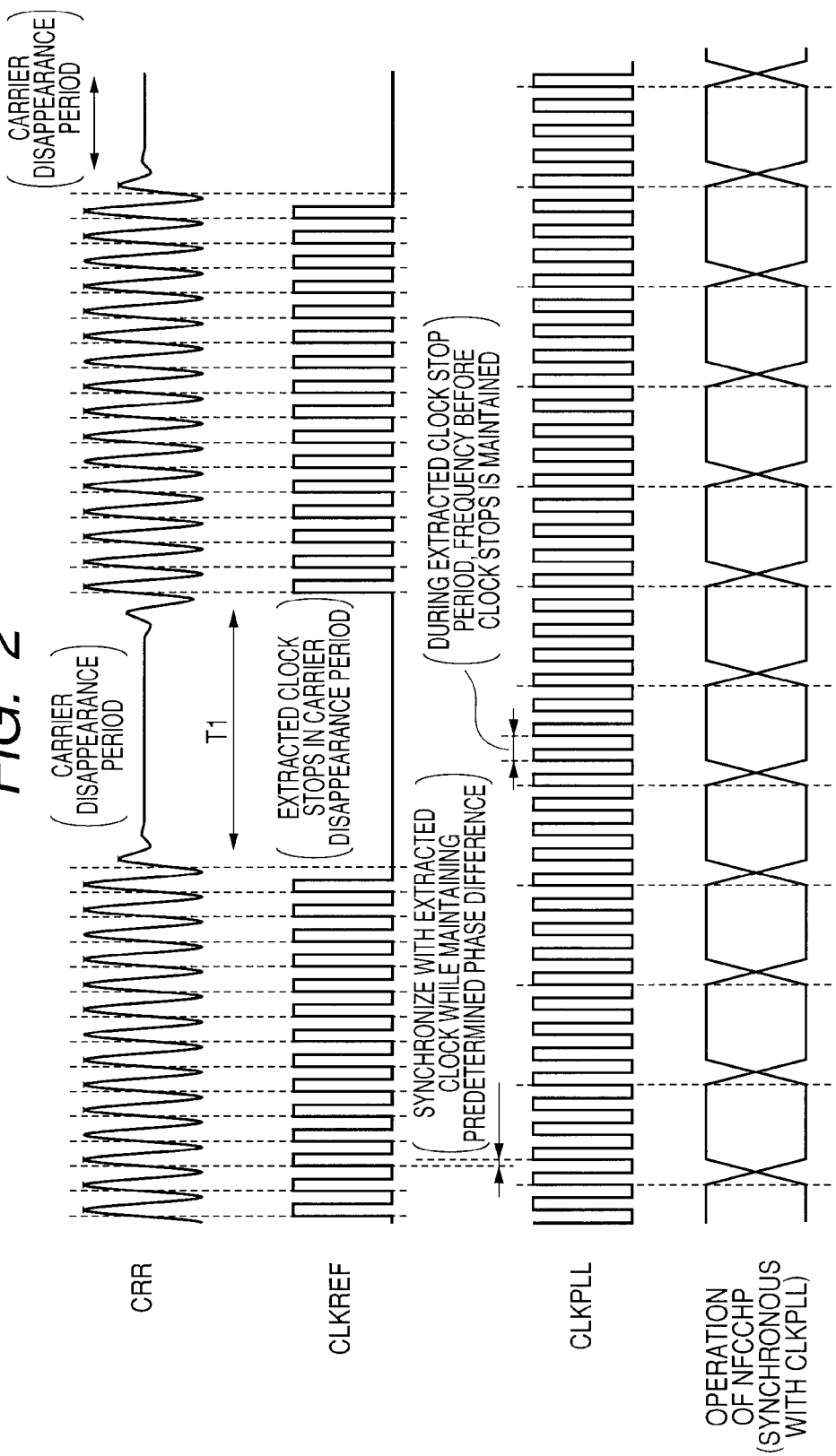
FIG. 2 is a signal waveform chart showing interruption of carrier waves, disappearance of extracted clocks, and maintenance of internal clocks.

The PLL circuit 13 receives the extracted clock signal CLKREF extracted by the reception circuit 12, generates an internal clock signal CLKPLL for the logic circuit 16, the transmission circuit 14, and the like, and performs control of making the internal clock signal CLKPLL synchronized with the extracted clock signal CLKREF. The specification of a transmission sign used by the NFC card 1 is called, for example, type A. In type A, for data transmission from the reader/writer 2 to the NFC card 1, Modified Miller encoding as a sign type is performed. For data transmission from an IC card to the reader/writer, Manchester data encoding as a sign type is performed. In the case of type A using the ASK 100% modulation method, as shown in FIG. 2, in a reception signal no-modulation period (T1), a carrier wave CRR disappears. In the period, a change in the extracted clock is stopped. As will be described in detail later, in a period T1 of disappearance of the carrier wave CRR received from the antenna 10, the PLL circuit 13 performs a control for maintaining the frequency of the internal clock signal CLKPLL to a value immediately before the disappearance period. In other words, in a stop period in which a change in the extracted clock signal CLKREF is stopped, the PLL circuit 13 performs a control for maintaining the frequency of the internal clock signal CLKPLL to a value immediately before the stop period.

Figure 3:
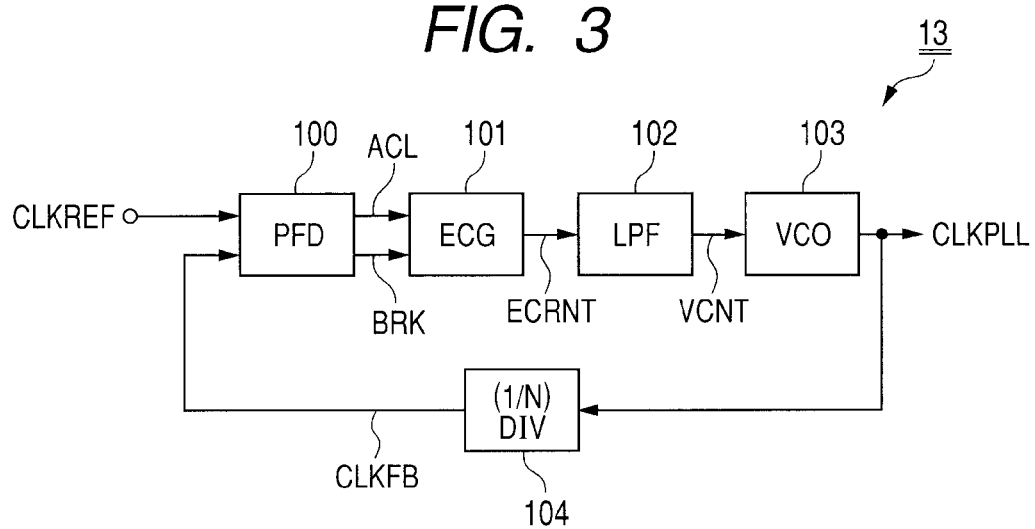
FIG. 3 is a block diagram showing an example of a PLL circuit as a clock reproduction circuit.

FIG. 3 shows an example of the PLL circuit 13 as a clock reproduction circuit. The PLL circuit 13 includes a phase frequency difference detection circuit (PFD) 100, a charge/discharge circuit (ECG) 101 as an error current generation circuit, a low pass filter (LPF) 102, a voltage controlled oscillation circuit (VCO) 103, and a frequency dividing circuit (DIV) 104.

Figure 4:
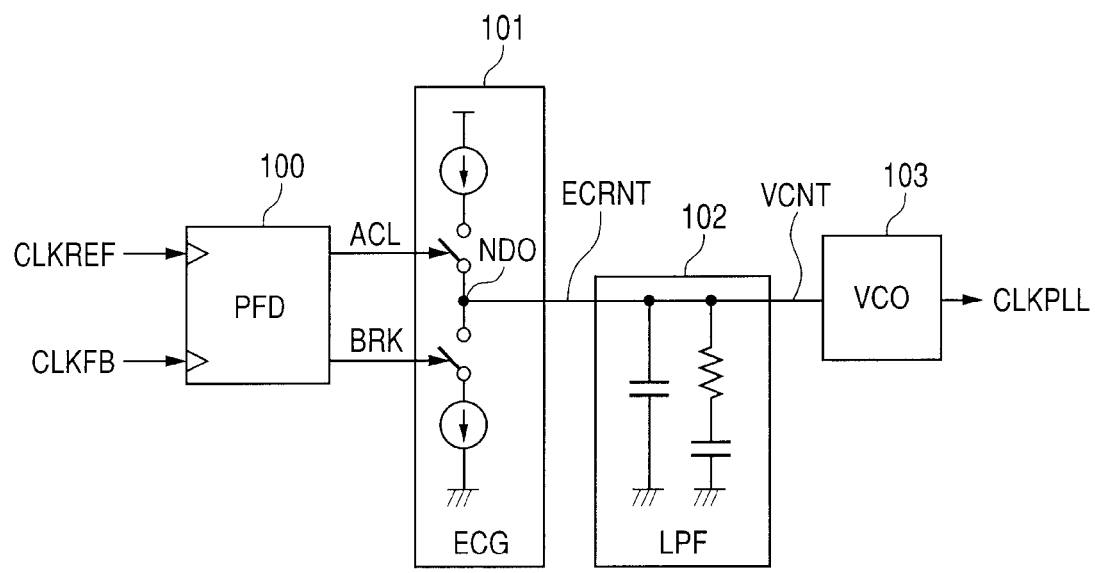
FIG. 4 is a block diagram illustrating outline of a charge and discharge circuit.

The frequency dividing circuit 104 divides the internal clock signal CLK and outputs a feedback signal CLKFB. The frequency division ratio is 1/N (N is a positive integer). The voltage controlled oscillation circuit (VCO) 103 increases the frequency of the clock signal CLKPLL to be output the higher a control voltage VCNT is, and decreases the frequency of the clock signal CLKPLL to be output the lower the input control voltage VCNT is. The phase frequency difference detection circuit 100 generates a charge error signal ACL and a discharge error signal BRK in accordance with the phase difference between the extracted clock signal CLKREF and a feedback signal CLKFB as a frequency division signal of the internal clock signal CLKPLL. The charge/discharge circuit 101 is configured by a push-pull circuit as illustrated in FIG. 4, charges an output node NDO on receipt of the charge error signal ACL, and discharges the output node NDO on receipt of the discharge error signal BRK. As a result, an error current ECRNT flows in the low pass filter circuit 102 coupled to the output node NDO. A voltage obtained is smoothed, and the smoothed voltage is output as the control voltage VCNT to the voltage controlled oscillation circuit (VCO) 103.

In the stop period of the extracted clock signal CLKREF, the phase frequency difference detection circuit 100 inactivates the charge error signal ACL and the discharge error signal BRK and stops an input of the low pass filter 102, that is, charging/discharging on the output node NDO. Consequently, the frequency of the internal clock signal CLKPLL is maintained to the frequency immediately before stop of the extracted clock signal CLKREF. If the control is not employed, when a reference clock (CLKREF) stops, the output clock (CLKPLL) follows it and is also stopped. In response to the stop of the extracted clock signal CLKREF, the internal clock CLKPLL also stops undesirably. In short, the reason of employing the PLL circuit in the present invention is, even when the reference clock stops, to maintain the frequency of the internal clock as an output clock in a state immediately before the stop.

Figure 5:
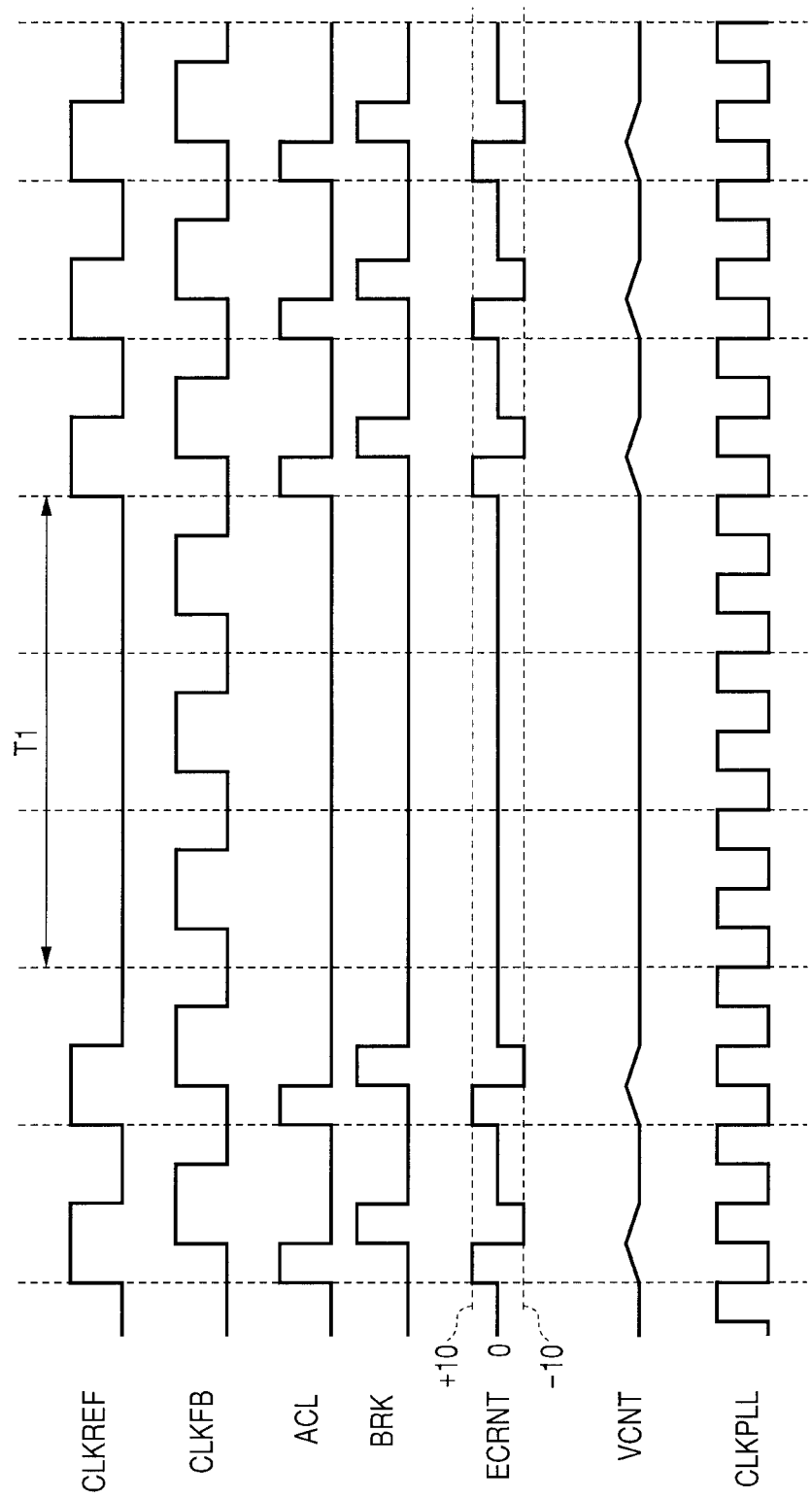
FIG. 5 is a timing chart illustrating waveforms of an internal clock signal CLKPLL when an extracted clock signal CLKREF stops in a stable state where the extracted clock signal CLKREF and the internal clock signal CLKPLL are in synchronization.

FIG. 5 illustrates the waveforms of the internal clock signal CLKPLL when the extracted clock signal CLKREF stops in a stable state where the extracted clock signal CLKREF and the internal clock signal CLKPLL are synchronized.

The charge error signal ACL is made active (high level) in the high level period of the extracted clock signal CLKREF and the low level period of the feedback signal CLKFB. The discharge error signal BRK is made active (high level) in the high level period of the extracted clock signal CLKREF and the high level period of the feedback signal CLKFB. Therefore, as shown in FIG. 5, in a state where the frequency of the extracted clock signal CLKREF and that of the feedback signal CLKFB are equal to each other and the phase of the feedback signal CLKFB retards by 90 degrees, the charge current and the discharge current are balanced, and this state is maintained. At this time, when a change in the clock signal CLKREF stops and the clock signal CLKREF does not change to the high level, both of the charge error signal ACL and the discharge error signal BRK are set to an inactive state. Similarly, the charge current and the discharge current are balanced at zero, and this state is maintained. As a result, also in the stop period T1 of the extracted clock signal CLKREF, an output of the internal clock signal CLKPLL is maintained stably. Since the transmission rate of data in ISO14443-A (type A method) is 106 kbps (kilo bits per second), 212 kbps, 424 kbps, 847 kbps, or the like, time in which a change in the extracted clock signal CLKREF is stopped due to disappearance of a carrier wave in correspondence with the no-modulation period of the reception signal is just time depending on the transmission rate. Time in which both of the charge error signal ACL and the discharge error signal BRK are set to the inactive state does not become conspicuously long, and stabilization of the internal clock signal CLKPLL is not disturbed.

Figure 6:
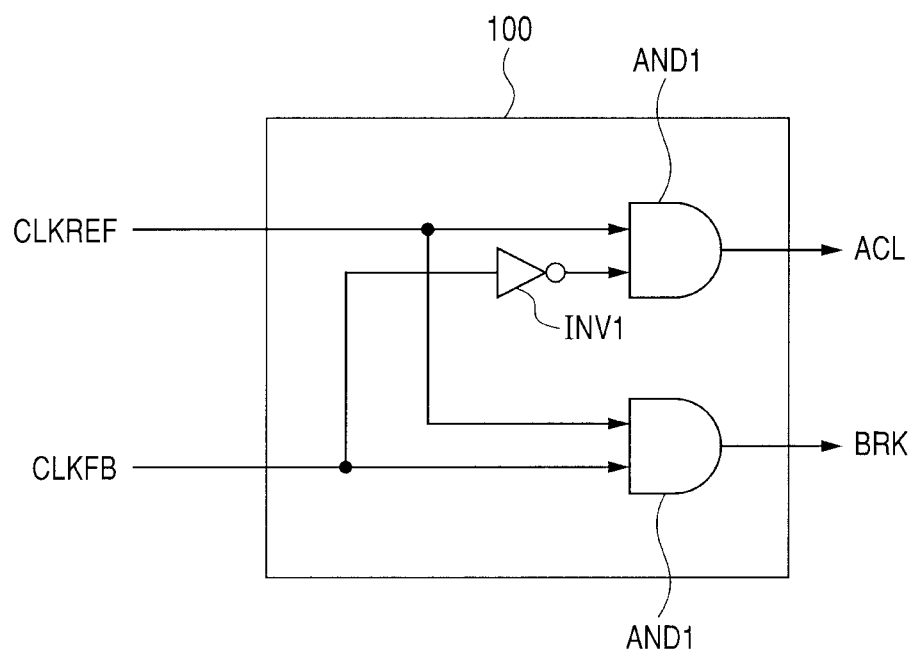
FIG. 6 is a block diagram showing an example of a phase frequency difference detection circuit.

FIG. 6 shows an example of the phase frequency difference detection circuit 100. In the diagram, by detecting the signal levels of the clock signal CLKREF and the feedback signal CLKFB by using 2-input AND gates AND1 and AND2 and an inverter INV1, the charge error signal ACL and the discharge error signal BRK are generated.

Figure 7:
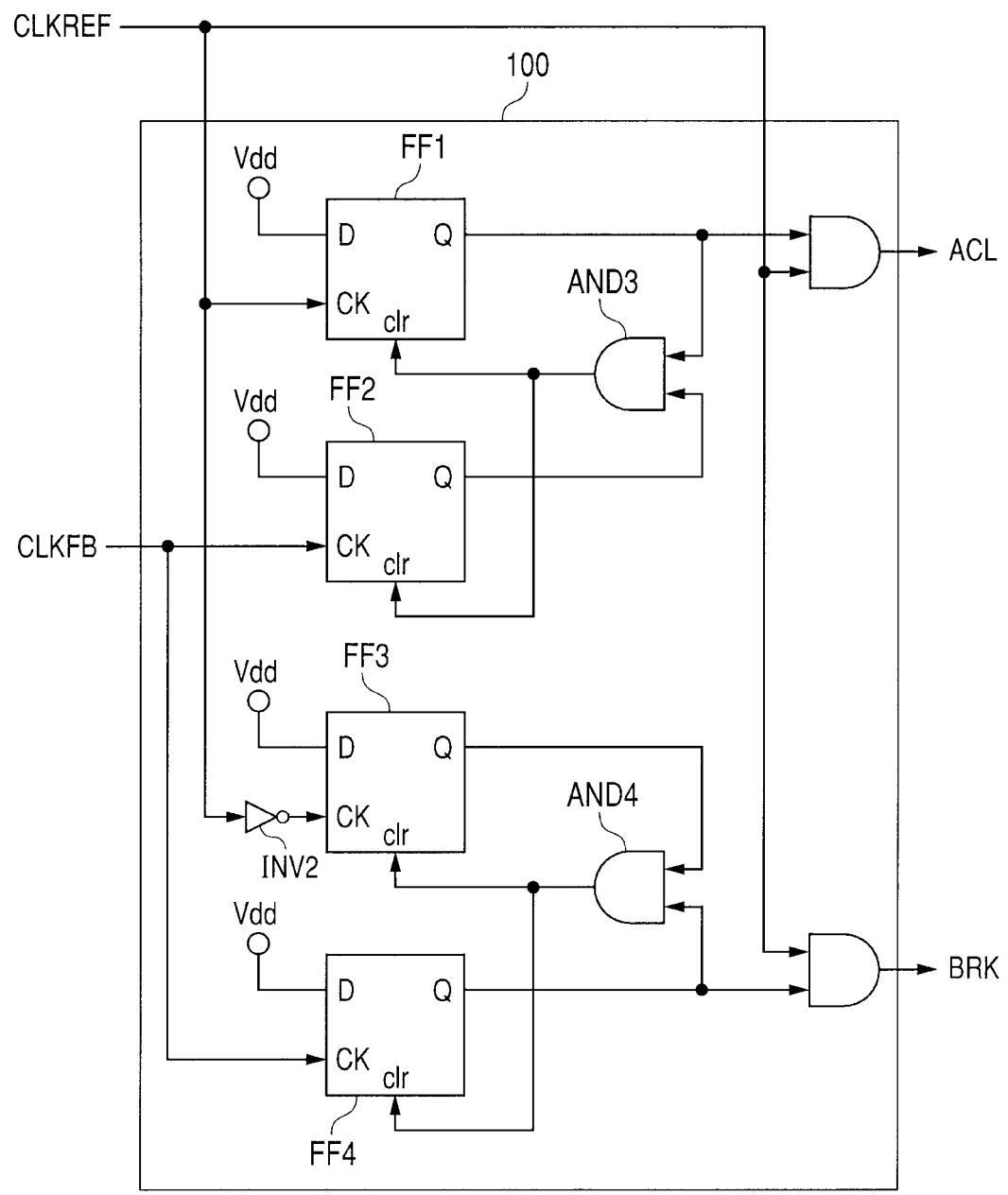
FIG. 7 is a block diagram showing another example of the phase frequency difference detection circuit.

FIG. 7 shows another example of the phase frequency difference detection circuit 100. In the diagram, the phase frequency difference detection circuit 100 is configured by using edge trigger D-type flip flops FF1 to FF4, 2-input AND gates AND3 and AND4, and an inverter INV2. With the configuration, ACL is inverted to the high level synchronously with the leading edge of CLKREF, and the high level is maintained until the leading edge of CLKFB. On the other hand, BRK is inverted to the high level synchronously with the leading ledge of CLKFB, and the high level is maintained until the trailing edge of CLKREF. As compared with the level detection of FIG. 6, the edge detection method of FIG. 7 has higher noise immunity.

Figure 8:
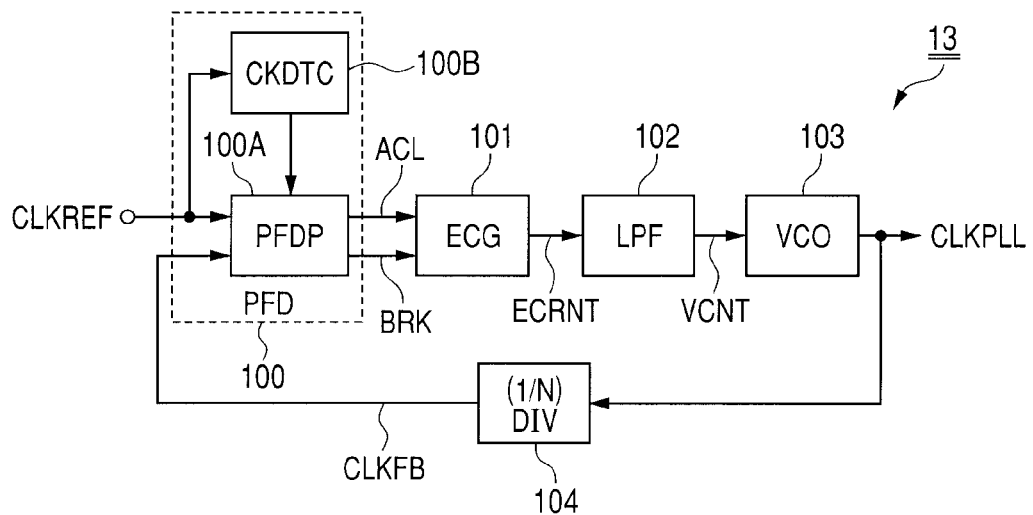
FIG. 8 is a block diagram showing further another example of the phase frequency difference detection circuit.
Figure 9:
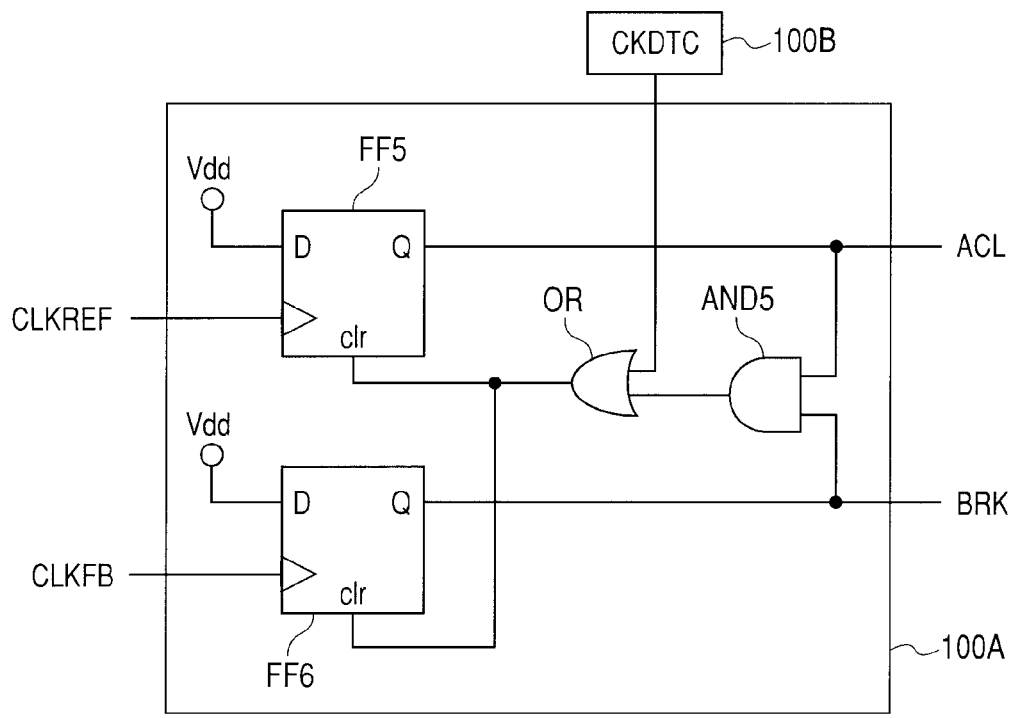
FIG. 9 is a block diagram showing an example of a phase frequency difference detection unit used in the example of FIG. 8.
Figure 10:
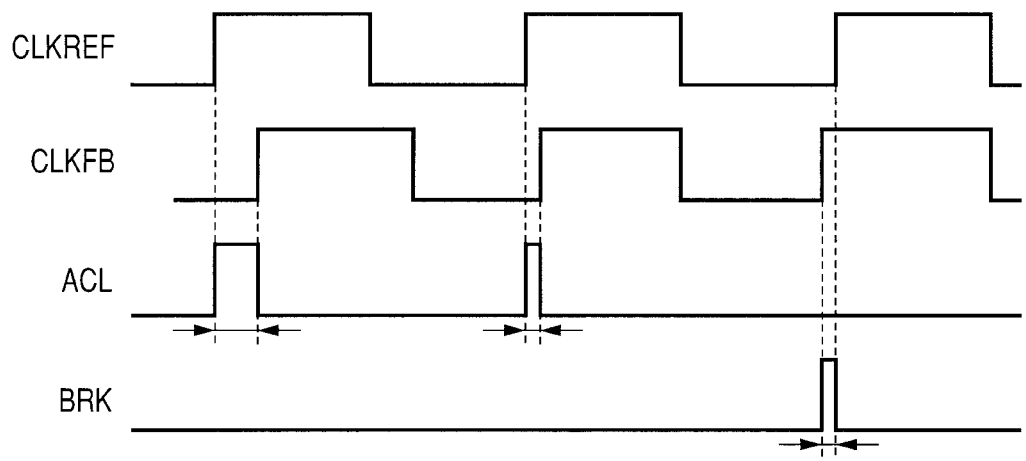
FIG. 10 is a timing chart illustrating operation timings of the phase frequency difference detection unit shown in FIG. 9.

FIG. 8 shows further another example of the phase frequency difference detection circuit 100. The phase frequency difference detection circuit 100 is configured by a phase frequency difference detection unit (PFDP) 100A and a clock detection unit (CKDTC) 100B. The phase frequency difference detection unit 100A includes, as illustrated in FIG. 9, edge-trigger-type flip flops FF5 and FF6, a 2-input AND (logical product) gate AND5, and an OR (logical sum) gate OR. To the OR gate OR, a detection signal of the high level output in the stop period of the extracted clock signal CLKREF is supplied from the clock detection unit (CKDTC) 100B. The operation waveforms of the phase frequency difference detection unit 100A are illustrated in FIG. 10. As obvious from FIGS. 9 and 10, in the configuration, when a change in CLKREF stops, CLKFB also stops. To prevent CLKFB from stopping, when stop of a change in CLKREF is detected, the clock detection unit 100B forcedly makes the signals ACL and BRK inactive in the stop period.

Figure 11:
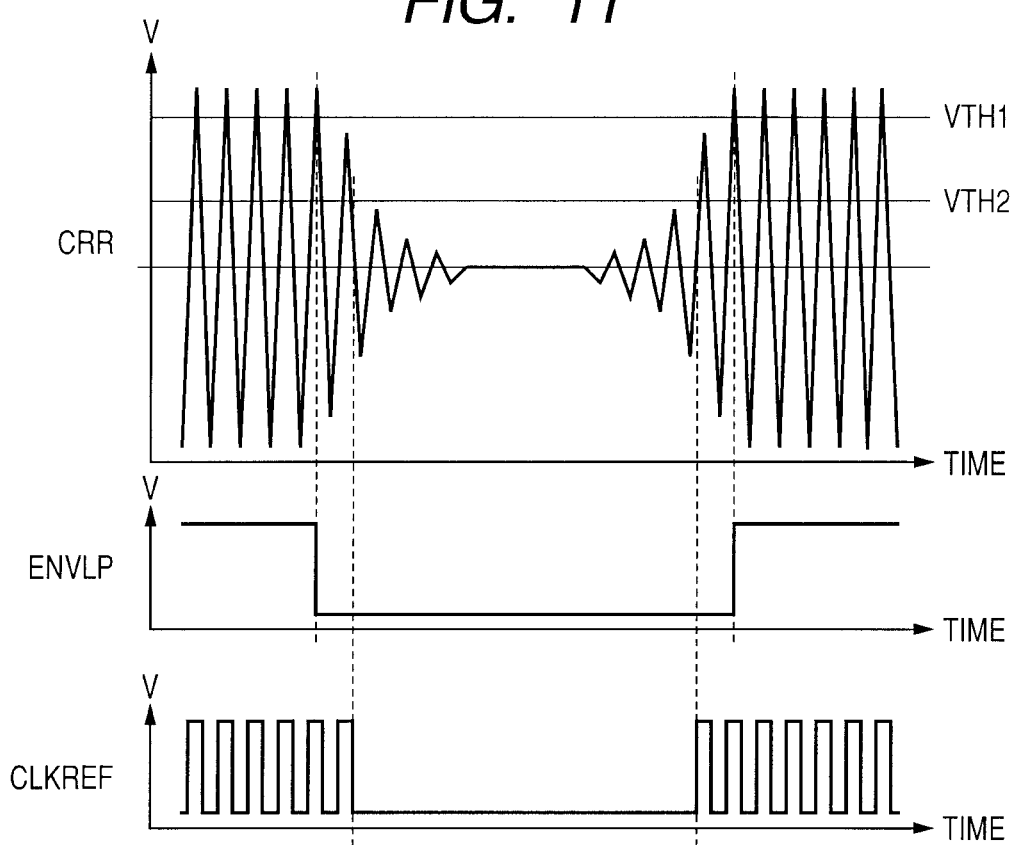
FIG. 11 is an explanatory diagram illustrating a method of detecting a stop state of the signal CLKREF by a clock detection circuit.

The stop of CLKREF can be detected by the clock detection unit 100B as follows. For example, as illustrated in FIG. 11, an envelope detection signal ENVLP of a carrier wave is compared with a first threshold (VTH1) (first determination) and compared with a second threshold (VTH2) smaller than the first threshold (second determination). When a second determination result becomes small (low level) for predetermined time or longer after a first determination result becomes small (low level), stop of the clock signal CLKREF is determined. When a second determination result becomes large (high level) after the second determination result becomes large (high level), restart of a change in the clock signal CLKREF is determined.

Figure 12:
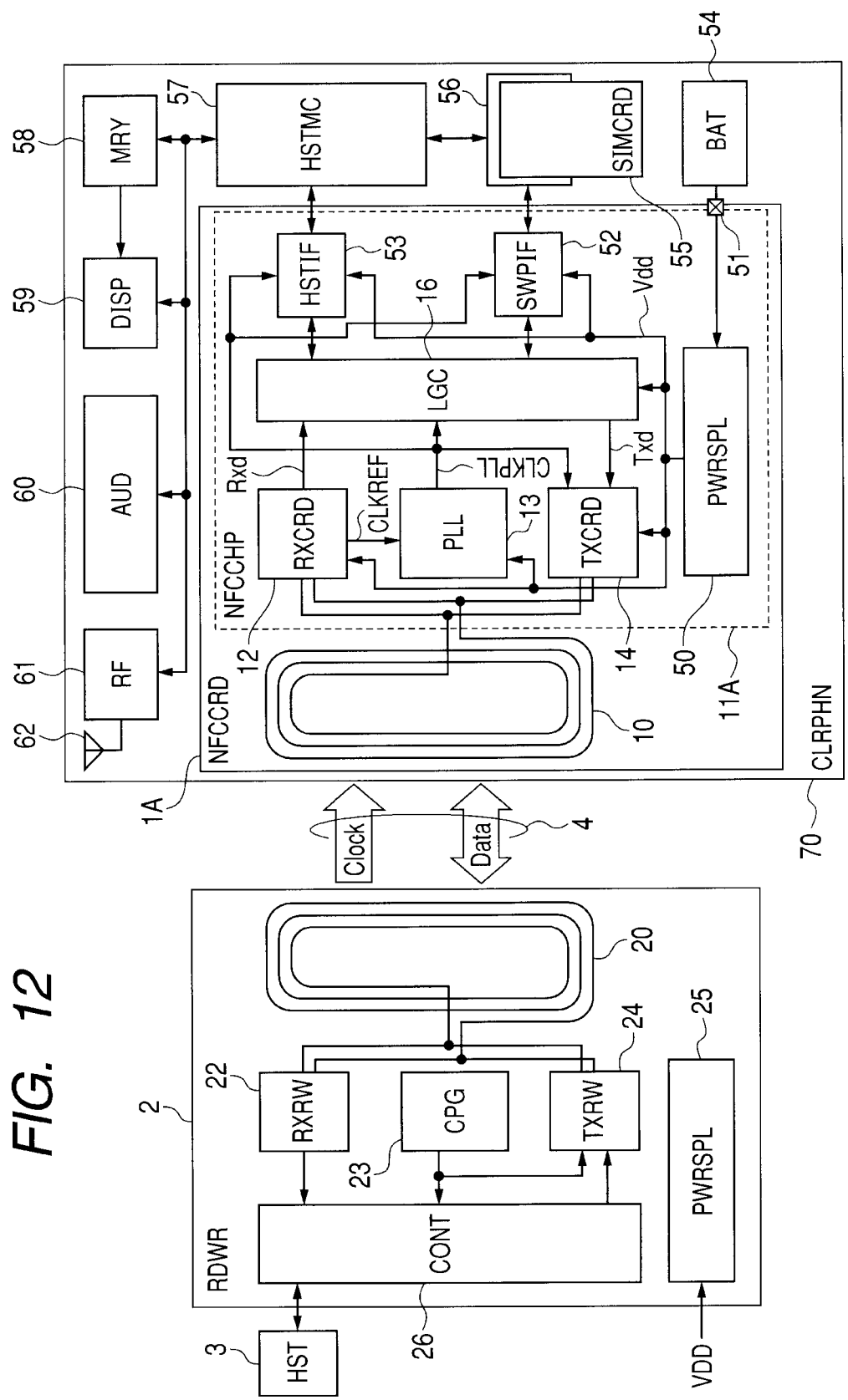
FIG. 12 is a block diagram showing a cellular phone as an example of a portable terminal on which an NFC chip according to the present invention is mounted.

FIG. 12 shows a portable terminal on which the NFC chip according to the present invention is mounted. A cellular phone (CLRPHN) 70 is used as an example of the portable terminal. On the cellular phone 70, an NFC card (NFCCRD) 1A is mounted. The NFC card 1A is different from the NFC card 1 of FIG. 1 with respect to the points that the external interface function is expanded, a battery power (BAT) 54 of the cellular phone 70 is used as an operation power, and the rectifying circuit 15 is not provided.

The different points will be described. A host interface circuit (HSTIF) 53 and an SWP interface circuit (SWPIF) 52 as the SIM interface circuit are added as external interface functions. An SIM card slot 56 is coupled to the SWP interface circuit 52, and an SIM card (SIMCRD) 55 is mounted on the SIM card slot 56. When an authenticating process is necessary for data communication by the NFC card 1A, authentication using the SIM card 55 can be performed. A host microcomputer (HSTMC) 57 is coupled to the host interface circuit 53. The host microcomputer 57 has, although not limited, a baseband processing function for performing a baseband process for a mobile communication, and an application processing function for performing a data process accompanying display control and the like. The host microcomputer 57 is configured by, for example, circuit units such as one or more processor cores, a RAM, a ROM, and various interface ports. To the host microcomputer 57, for example, an RF (Radio Frequency) circuit 61 for mobile communication coupled to an antenna 62, an audio processor (AUD) 60 coupled to a microphone or earphones, a liquid crystal display (DISP) 59, a frame buffer memory (MRY) 58 for display, and the like are coupled.

The cellular phone 70 shown in the diagram can perform near field noncontact communication together with mobile communication. Particularly, in the near field noncontact communication, an authenticating process using the SIM card 55 can be performed by receiving data from the NFC card 1A directly by the SIM card 55 not via the host microcomputer 57. In this case, even when the carrier wave is discretely interrupted in the noncontact communication of the type A method, the clock signal CLKPLL is generated continuously without interruption as described above. Therefore, even if there is the carrier disappearance period as shown in FIG. 13, in parallel with data reception (Type A_Rx) of the type A method and data transmission (Type A_Tx) of the type A method of the NFC card 1A, the SIM card 55 receives necessary data (SWP_Rx) from the SWP interface circuit 52, performs authenticating process (Prcs), and responds the data (SWP_Tx). If the present invention is not employed, as shown in FIG. 14, clock signals disappear as the carrier waves disappear, and transmission and reception (Type A_Tx and Type A_Rx) between the NFC card and the reader/writer and transmission and reception (SWP_Tx and SWP_Rx) between the NFC card and the SIM card have to be performed in series.

According to the present invention, therefore, communication with the SIM card can be performed by SWP in parallel with the noncontact communication, and the interface between the cellular phone and the SIM card can be conformed with the communication protocol "ETSITS 102 613". The present invention can also satisfy a demand of, for example, shortening of communication time by an application in a ticket gate for a train or the like.

The operation power of the NFC chip 11A is supplied when a power supply circuit (PWRSPL) 50 receives power supply from an external power supply terminal 51 coupled to the battery power 54 of the cellular phone 70. With the configuration, a rectifying circuit can be eliminated. The chip area can be reduced only by a stabilization capacitance whose occupation area is relatively large for the NFC chip 11A. Further, even when the carrier wave is interrupted, the power supply voltage of the NFC chip 11A is not influenced, so that it can contribute to stabilization of the operation power supply. Since the operation power of the NFC chip 11A is supplied from the battery 54, "power" as shown in FIG. 1 is not shown in electromagnetic waves expressed by reference numeral 4.

Although the present invention achieved by the inventors of the present invention has been described concretely on the basis of the embodiment, obviously, the invention is not limited to the embodiment but can be variously changed without departing from the gist.

For example, the configuration for preventing the internal clock signal CLKPLL from being interrupted in the carrier disappearance period is not limited to the configuration shown in FIG. 6 and the like but can be properly changed. A modulation signal received by the NFC chip is not limited to a modulation signal subjected to amplitude modulation of the modulation ratio of 100%. The present invention can be applied also to an IC card in which an IC card microcomputer for performing securing process and an NFC chip are mounted on a card substrate.

What is claimed is:

1. A semiconductor device comprising:
a reception circuit configured to receive an amplitude-modulated carrier wave from an antenna, to demodulate said carrier wave, and to extract a clock signal from the carrier wave;
a logic circuit configured to perform a data process on a reception signal by the reception circuit; and
a PLL circuit configured to receive the clock signal extracted by the reception circuit, to generate an internal clock signal of the logic circuit, and to control synchronization of the internal clock signal with the extracted clock signal,
wherein the PLL circuit is further configured to continue to generate the internal clock signal during a period of stopping of a change in the extracted clock signal,
wherein the PLL circuit comprises an error current generation circuit coupled to a low pass filter, and a voltage controlled oscillation circuit coupled to an output of the low pass filter,
wherein the error current generation circuit outputs an error current signal to the low pass filter which is based on a charge error signal and a discharge error signal,
wherein the error current generation circuit is configured to output said error current signal to cause the low pass filter to stop charging/discharging during the period of stopping of a change in the extracted clock signal and
wherein the PLL circuit comprises
a phase frequency difference detection circuit configured to generate a charge error signal and a discharge error signal in accordance with a phase difference between the extracted clock signal and a feedback signal synchronized with an internal clock signal; and
a charge/discharge circuit configured to charge an output node upon receiving the charge error signal and to discharge the output node upon receiving the discharge error signal,
wherein the output node of the charge/discharge circuit is coupled to an input of the low pass filter, and
wherein the phase frequency difference detection circuit is configured to:
when a frequency of the extracted clock signal and a frequency of the feedback signal are equal to each other, and a phase of the feedback signal follows a phase of the extracted clock signal by 90 degrees, the phase frequency difference detection circuit equalizes a charge amount of the output node by the charge error signal and a discharge amount of the output node by the discharge error signal, and
when the frequency of the extracted clock signal and the frequency of the feedback signal are not equal to each other, or the phase of the feedback signal does not follow the phase of the extracted clock signal by 90 degrees, the phase frequency difference detection circuit shifts the charge amount or the discharge amount of the output node so as to suppress a deviation amount, and the phase frequency difference detection circuit stops both charging of the output node being performed in response to the charge error signal and discharging of the output node being performed in response to the discharge error signal in accordance with disappearance of the first period caused by stop of a change in the extracted clock signal.

2. The semiconductor device according to claim 1, wherein the amplitude modulation is ASK 100% modulation whose target is 100% of amplitude of a carrier wave.

3. The semiconductor device according to claim 1, further comprising an internal power supply circuit configured to generate an internal operation power supply voltage by receiving the carrier wave from an antenna and rectifying said carrier wave.

4. The semiconductor device according to claim 1, further comprising an external power supply terminal to which an operation power is supplied from outside of the semiconductor device.

5. The semiconductor device according to claim 1, wherein the semiconductor device is formed over a single semiconductor substrate.

6. An IC card comprising:
an antenna; and
a semiconductor device coupled to the antenna and comprising
a reception circuit configured to receive an amplitude-modulated carrier wave from the antenna, to demodulate said carrier wave, and to extract a clock signal from the carrier wave;
a logic circuit configured to perform a data process on a reception signal by the reception circuit;
a PLL circuit configured to receive the clock signal extracted by the reception circuit, to generate an internal clock signal of the logic circuit, and to control synchronization of the internal clock signal with the extracted clock signal; and
a rectifier which rectifies the carrier wave from the antenna and generates an operation power of the semiconductor device,
wherein the PLL circuit is further configured to continue to generate the internal clock signal during a period of stopping of a change in the extracted clock signal, wherein the PLL circuit comprises an error current generation circuit coupled to a low pass filter, and a voltage controlled oscillation circuit coupled to an output of the low pass filter, wherein the error current generation circuit outputs an error current signal to the low pass filter which is based on a charge error signal and a discharge error signal, wherein the error current generation circuit is configured to output said error current signal to cause the low pass filter to stop charging/discharging during the period of stopping of a change in the extracted clock signal and wherein the PLL circuit further comprises a phase frequency difference detection circuit configured to generate a charge error signal and a discharge error signal in accordance with a phase difference between the extracted clock signal and a feedback signal synchronized with an internal clock signal; and a charge/discharge circuit configured to charge an output node upon receiving the charge error signal and to discharge the output node upon receiving the discharge error signal, wherein the output node of the charge/discharge circuit is coupled to an input of the low pass filter, and wherein the phase frequency difference detection circuit is configured to:

when a frequency of the extracted clock signal and a frequency of the feedback signal are equal to each other, and a phase of the feedback signal follows a phase of the extracted clock signal by 90 degrees, the phase frequency difference detection circuit equalizes a charge amount of the output node by the charge error signal and a discharge amount of the output node by the discharge error signal, and when the frequency of the extracted clock signal and the frequency of the feedback signal are not equal to each other, or the phase of the feedback signal does not follow the phase of the extracted clock signal by 90 degrees, the phase frequency difference detection circuit shifts the charge amount or the discharge amount of the output node so as to suppress a deviation amount, and the phase frequency difference detection circuit stops both charging of the output node being performed in response to the charge error signal and discharging of the output node being performed in response to the discharge error signal in accordance with disappearance of the first period caused by stop of a change in the extracted clock signal.

7. A portable communication terminal comprising:

a first antenna;

an RF circuit coupled to the first antenna;

a host microcomputer which performs at least baseband processing for mobile communication;

a semiconductor device coupled to the host microcomputer;

a battery power supply to supply operation power to the semiconductor device; and a second antenna coupled to the semiconductor device, wherein the semiconductor device comprises a reception circuit configured to receive an amplitude-modulated carrier wave from the second antenna, to demodulate said carrier wave, and to extract a clock signal from the carrier wave;

a logic circuit configured to perform a data process on a reception signal by the reception circuit; and a PLL circuit configured to receive the clock signal extracted by the reception circuit, to generate an internal clock signal of the logic circuit, and to control synchronization of the internal clock signal with the extracted clock signal, wherein the PLL circuit is further configured to continue to generate the internal clock signal during a period of stopping of a change in the extracted clock signal, wherein the PLL circuit comprises an error current generation circuit coupled to a low pass filter, and a voltage controlled oscillation circuit coupled to an output of the low pass filter, wherein the error current generation circuit outputs an error current signal to the low pass filter which is based on a charge error signal and a discharge error signal, wherein the error current generation circuit is configured to output said error current signal to cause the low pass filter to stop charging/discharging during the period of stopping of a change in the extracted clock signal and wherein the PLL circuit comprises a phase frequency difference detection circuit configured to generate a charge error signal and a discharge error signal in accordance with a phase difference between the extracted clock signal and a feedback signal synchronized with an internal clock signal; and a charge/discharge circuit configured to charge an output node upon receiving the charge error signal and to discharge the output node upon receiving the discharge error signal, wherein the output node of the charge/discharge circuit is coupled to an input of the low pass filter, and wherein the phase frequency difference detection circuit is configured to:

when a frequency of the extracted clock signal and a frequency of the feedback signal are equal to each other, and a phase of the feedback signal follows a phase of the extracted clock signal by 90 degrees, the phase frequency difference detection circuit equalizes a charge amount of the output node by the charge error signal and a discharge amount of the output node by the discharge error signal, and when the frequency of the extracted clock signal and the frequency of the feedback signal are not equal to each other, or the phase of the feedback signal does not follow the phase of the extracted clock signal by 90 degrees, the phase frequency difference detection circuit shifts the charge amount or the discharge amount of the output node so as to suppress a deviation amount, and the phase frequency difference detection circuit stops both charging of the output node being performed in response to the charge error signal and discharging of the output node being performed in response to the discharge error signal in accordance with disappearance of the first period caused by stop of a change in the extracted clock signal.

* * * * *